US010095131B2

(12) United States Patent
Kramer et al.

(10) Patent No.: US 10,095,131 B2
(45) Date of Patent: Oct. 9, 2018

(54) ALIGNMENT MODELING AND A LITHOGRAPHIC APPARATUS AND EXPOSURE METHOD USING THE SAME

(71) Applicant: ASML Netherlands B.V., Veldhoven (NL)

(72) Inventors: Pieter Jacob Kramer, Veldhoven (NL); Rogier Sebastiaan Gilijamse, Eindhoven (NL); Niels Lammers, Sittard (NL); Daan Maurits Slotboom, Wolphaartsdijk (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/315,885

(22) PCT Filed: May 13, 2015

(86) PCT No.: PCT/EP2015/060537
§ 371 (c)(1),
(2) Date: Dec. 2, 2016

(87) PCT Pub. No.: WO2015/189001
PCT Pub. Date: Dec. 17, 2015

(65) Prior Publication Data
US 2017/0108783 A1 Apr. 20, 2017

(30) Foreign Application Priority Data
Jun. 12, 2014 (EP) .................................. 14172053

(51) Int. Cl.
*G03F 7/20* (2006.01)
*G03F 9/00* (2006.01)
(52) U.S. Cl.
CPC ............ *G03F 9/7046* (2013.01); *G03F 7/706* (2013.01); *G03F 7/70141* (2013.01);
(Continued)

(58) Field of Classification Search
CPC .... G03F 9/7046; G03F 9/7049; G03F 9/7073; G03F 9/7003; G03F 7/70633; G03F 7/70775; G03F 7/70483; G03F 7/70525
See application file for complete search history.

(56) References Cited

U.S. PATENT DOCUMENTS

| 6,064,486 A * | 5/2000 | Chen ......................... G03F 9/70 356/399 |
| 8,194,242 B2 | 6/2012 | Derksen et al. |

(Continued)

FOREIGN PATENT DOCUMENTS

| TW | 201015250 | 4/2010 |
| TW | 201042404 | 12/2010 |

(Continued)

OTHER PUBLICATIONS

International Search Report and Written Opinion dated Nov. 2, 2015 in corresponding International Patent Application No. PCT/EP2015/060537.

(Continued)

*Primary Examiner* — Michelle M Iacoletti
(74) *Attorney, Agent, or Firm* — Pillsbury Winthrop Shaw Pittman LLP

(57) ABSTRACT

A method including determining a position of a first pattern in each of a plurality of target portions on a substrate, based on a fitted mathematical model, wherein the first pattern includes at least one alignment mark, wherein the mathematical model is fitted to a plurality of alignment mark displacements (dx, dy) for the alignment marks in the target portions, and wherein the alignment mark displacements are a difference between a respective nominal position of the alignment mark and measured position of the alignment mark; and transferring a second pattern onto each of the target portions, using the determined position of the first pattern in each of the plurality of target portions, wherein the (Continued)

mathematical model includes polynomials Z1 and Z2: $Z1=r^2 \cos(2\theta)$ and $Z2=r^2 \sin(2\theta)$ in polar coordinates (r, θ) or $Z1=x^2-y^2$ and $Z2=xy$ in Cartesian coordinates (x, y).

22 Claims, 7 Drawing Sheets

(52) U.S. Cl.
CPC ...... *G03F 7/70483* (2013.01); *G03F 7/70525* (2013.01); *G03F 7/70633* (2013.01); *G03F 7/70775* (2013.01); *G03F 9/7003* (2013.01); *G03F 9/7049* (2013.01); *G03F 9/7073* (2013.01)

(56) References Cited

U.S. PATENT DOCUMENTS

| | | |
|---|---|---|
| 8,269,949 B2 | 9/2012 | Vermeulen et al. |
| 8,706,442 B2 | 4/2014 | Mos et al. |
| 8,842,293 B2 | 9/2014 | Den Boef et al. |
| 8,887,107 B2 | 11/2014 | Mos et al. |
| 9,454,084 B2 | 9/2016 | Lyulina et al. |
| 2005/0202328 A1* | 9/2005 | Smith .............. G03F 7/701 430/30 |
| 2007/0026325 A1 | 2/2007 | Derksen et al. |
| 2007/0258624 A1* | 11/2007 | Mochida .......... G03F 7/70633 382/106 |
| 2009/0325088 A1* | 12/2009 | Sjostrom ............ G03F 1/42 430/30 |
| 2010/0085551 A1 | 4/2010 | Vermeulen et al. |
| 2010/0233600 A1 | 9/2010 | Den Boef et al. |
| 2011/0196646 A1 | 8/2011 | Mos et al. |
| 2011/0207247 A1 | 8/2011 | Hwang |
| 2013/0041494 A1* | 2/2013 | Ausschnitt ........ G05B 19/401 700/98 |
| 2014/0089870 A1 | 3/2014 | Mos et al. |
| 2015/0146188 A1 | 5/2015 | Lyulina et al. |
| 2015/0205213 A1 | 7/2015 | Cekli et al. |

FOREIGN PATENT DOCUMENTS

| | | |
|---|---|---|
| WO | 2010/006935 | 1/2010 |
| WO | 2013/178404 | 12/2013 |
| WO | 2014/032833 | 3/2014 |

OTHER PUBLICATIONS

Michael Pike et al., "High Order Wafer Alignment in Manufacturing," Proc. of SPIE, vol. 8324, pp. 832408-1-832408-11 (Mar. 29, 2012).

Chinese Office Action dated Aug. 21, 2017 in corresponding Chinese Patent Application No. 201580030769.0.

* cited by examiner $$Z1 = r^2 \cos(2\theta) \quad Z2 = r^2 \sin(2\theta) \quad \text{in polar coordinates (r, } \theta\text{) or}$$

$$Z1 = x^2 - y^2 \quad Z2 = xy \quad \text{in Cartesian coordinates (x, y).}$$

(501)

$$\begin{aligned} dx &= Mx \cdot x - Ry \cdot y + Cx \\ dy &= Rx \cdot x - My \cdot y + Cy \end{aligned}$$

(502)

$$\begin{pmatrix} dx \\ dy \end{pmatrix} = \begin{pmatrix} x^2 - y^2 \\ 2xy \end{pmatrix} \quad \text{in Cartesian coordinates (x, y) or}$$

$$\begin{pmatrix} dx \\ dy \end{pmatrix} = \begin{pmatrix} r^2 \cos(2\theta) \\ r^2 \sin(2\theta) \end{pmatrix} \quad \text{in Polar coordinates (r, } \theta\text{)}$$

(503)

$$\begin{pmatrix} dx \\ dy \end{pmatrix} = \begin{pmatrix} \mu x \cdot r^2 \cos(2\theta - \alpha x) \\ \mu y \cdot r^2 \sin(2\theta - \alpha y) \end{pmatrix}$$

(504)

$$\begin{pmatrix} dx \\ dy \end{pmatrix} = \mu \cdot r^2 \begin{pmatrix} \cos(2\theta - \alpha) \\ \sin(2\theta - \alpha) \end{pmatrix}$$

$$\begin{pmatrix} dx \\ dy \end{pmatrix} = \mu \cdot r^2 \begin{pmatrix} \cos(2\theta - \alpha) \\ \sin(2\theta - \alpha) \end{pmatrix} = \mu \cdot r^2 \begin{pmatrix} \cos(2\theta)\cos(\alpha) + \sin(2\theta)\sin(\alpha) \\ \cos(2\theta)\sin(-\alpha) + \sin(2\theta)\cos(\alpha) \end{pmatrix} \quad (601)$$

$$C1 = -\mu \cdot \cos(\alpha), \; C2 = \mu \cdot \sin(\alpha) \quad (602)$$

$$\begin{pmatrix} dx \\ dy \end{pmatrix} = r^2 \begin{pmatrix} C1 \cdot \cos(2\theta) + C2\sin(2\theta) \\ -C2 \cdot \cos(2\theta) + C1 \cdot \sin(2\theta) \end{pmatrix} \quad (603)$$

$$B = A \cdot C \quad (604)$$

$$B = \begin{pmatrix} dx(1) \\ dx(2) \\ \ldots \\ dx(N) \\ dy(1) \\ dy(2) \\ \ldots \\ dy(M) \end{pmatrix}, \quad C = \begin{pmatrix} C1 \\ C2 \end{pmatrix}, \quad A = \begin{pmatrix} Ax \\ Ay \end{pmatrix},$$

$$Ax = \begin{pmatrix} r_1^2 \cos(2\theta_1) & r_1^2 \sin(2\theta_1) \\ r_2^2 \cos(2\theta_2) & r_2^2 \sin(2\theta_2) \\ \ldots & \ldots \\ r_N^2 \cos(2\theta_N) & r_N^2 \sin(2\theta_N) \end{pmatrix}, \quad Ay = \begin{pmatrix} r_1^2 \sin(2\theta_1) & -r_1^2 \cos(2\theta_1) \\ r_2^2 \sin(2\theta_2) & -r_2^2 \cos(2\theta_2) \\ \ldots & \ldots \\ r_M^2 \sin(2\theta_M) & -r_M^2 \cos(2\theta_M) \end{pmatrix}$$

$$\mu = \sqrt{C1^2 + C2^2}$$
$$\alpha = \tan^{-1}\left(\frac{C2}{C1}\right) \quad (605)$$

Figure 6

$$dx = Mx \cdot xc - Ry \cdot yc + Cx + \mu x \cdot (xc^2 - yc^2)$$
$$dy = Rx \cdot xc - My \cdot yc + Cy + \mu y \cdot xc \cdot yc \tag{701}$$

$Mx = My = M,$
$Rx = Ry = R,$  (702)
$\mu x = \mu y = \mu,$
$\alpha x = \alpha y = \alpha.$

Figure 7

ALIGNMENT MODELING AND A LITHOGRAPHIC APPARATUS AND EXPOSURE METHOD USING THE SAME

CROSS-REFERENCE TO RELATED APPLICATIONS

This application is the U.S. national phase entry of PCT patent application no. PCT/EP2015/060537, which was filed on May 13, 2015, which claims the benefit of priority of EP application no. 14172053.2, which was filed on Jun. 12, 2014, and which is incorporated herein in its entirety by reference.

FIELD

The present invention relates to a lithographic apparatus and an exposure method. The present invention in particular relates to an alignment method for use during an exposure process of a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Typically, the manufacturing of an integrated circuit requires that multiple patterns are applied sequentially to the substrate, whereby the multiple patterns are stacked on top of each other. When multiple patterns are thus transferred subsequently to a substrate, it may be desired to align subsequent patterns relative to each other (i.e. when a new pattern is applied, this pattern should be aligned with a pattern in a lower layer). To align a subsequent pattern to a previously transferred pattern it is important to know the location of the previously transferred pattern. In order to determine the location of a pattern on a wafer, alignment marks are transferred to predefined positions on the substrate as part of said pattern. By measuring the position of the alignment marks, information can be obtained which can be used to transfer a subsequent pattern relative to the previously transferred pattern to the substrate.

The position information of a previously transferred pattern as required for accurately transferring a subsequent pattern relative to the previously transferred pattern thus needs to be derived from the position measurements of the alignment marks. Typically, not all areas of a pattern can be used to place alignment marks; alignment marks are therefore usually placed at edges of a pattern or in so-called scribe-lanes along a circumference of a pattern. As such, the alignment mark measurements may provide in position information about the edges of the previously transferred pattern, while it is important that the center regions of the pattern used to manufacture integrated circuits are aligned with respect to each other.

To solve this, a model can be fitted to the measured positions of the alignment marks. This model can then be used to estimate the position information of a previously transferred pattern. Such position information of a previously transferred pattern (i.e. present in a lower layer) can be considered a target position for a subsequent pattern and may thus be used to accurately transfer a subsequent pattern relative to the previously transferred pattern at a desired (target) position.

Such models may e.g. be used to represent effects such as translation errors, rotation errors or magnification errors.

In order to more accurately estimate the actual position of a previously transferred pattern based on the measured positions of the alignment marks, more complex models such as higher order models are implemented as well.

The use of such higher order model may however have one or more of the following adverse effects:

Typically, a higher order model, e.g. applying higher order polynomials or basis functions may contain a comparatively large number of parameters that needs to be determined. Determining such large number of parameters requires a comparatively large number of alignment marks to be measured. This could be time consuming, thus adversely affecting the throughput of the apparatus.

The more complex the applied model and thus the more parameters that are applied, may pose a risk with respect to the accuracy of the model; a higher order model introduces a high number of degrees of freedom and may introduce parameter induced noise.

SUMMARY

It would be desirable to provide an exposure process, as e.g. applied by a lithographic apparatus, with a more effective alignment method. According to an aspect of the invention, there is provided an exposure method comprising the steps of a) transferring a first pattern onto each of a plurality of target portions of a substrate, the first pattern including at least one alignment mark;

b) measuring a plurality of positions of a respective plurality of alignment marks transferred during step a) and determining a plurality of alignment mark displacements (dx, dy) for the respective plurality of alignment marks as a difference between a respective predetermined nominal position of the alignment mark and the respective measured position of the alignment mark;

c) fitting a mathematical model to the plurality of alignment mark displacements to obtain a fitted mathematical model, d) determining a position of the first pattern in each of the plurality of target portions, based on the fitted mathematical model;

e) transferring a second pattern onto each of the plurality of target portions, using the determined position of the first pattern in each of the plurality of target portions, wherein the mathematical model comprises polynomials Z1 and Z2:

$Z1 = r^2 \cos(2\theta)$ $Z2 = r^2 \sin(2\theta)$ in polar coordinates $(r, \theta)$ or $Z1 = x^2 - y^2$ $Z2 = xy$ in Cartesian coordinates $(x, y)$.

According to an other aspect of the invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate;

an alignment system configured to measure a position of an alignment mark;

a control unit for controlling an operation of the lithographic apparatus, wherein the projection system is configured to project a first patterned radiation beam onto a plurality of target portions of the substrate, thereby transferring a first pattern onto each of the target portions of the substrate, the first pattern including at least one alignment mark;

wherein the alignment system is configured to measure a position of a plurality of alignment marks and determine an alignment mark displacement (dx, dy) for each of the plurality of alignment marks as a difference between a respective predetermined nominal position of the alignment mark and the respective measured position of the alignment mark;

wherein the control unit is configured to fit a mathematical model to the plurality of alignment mark displacements to obtain a fitted mathematical model, and determine a position of the first pattern in each of the plurality of target portions, based on the fitted mathematical model, the mathematical model comprising polynomials P1 and P2:

$Z1=r^2 \cos(2\theta)$ $Z2=r^2 \sin(2\theta)$ in polar coordinates $(r,\theta)$ or $Z1=X^2-y^2$ $Z2=xy$ in Cartesian coordinates $(x,y)$ and wherein, the projection system is configured to project a second patterned radiation beam onto the plurality of target portions of the substrate, using the determined position of the first pattern in each of the plurality of target portions.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 5 to 7 depict equations as applied in the mathematical models used in the present invention.

DETAILED DESCRIPTION

Figure 1:
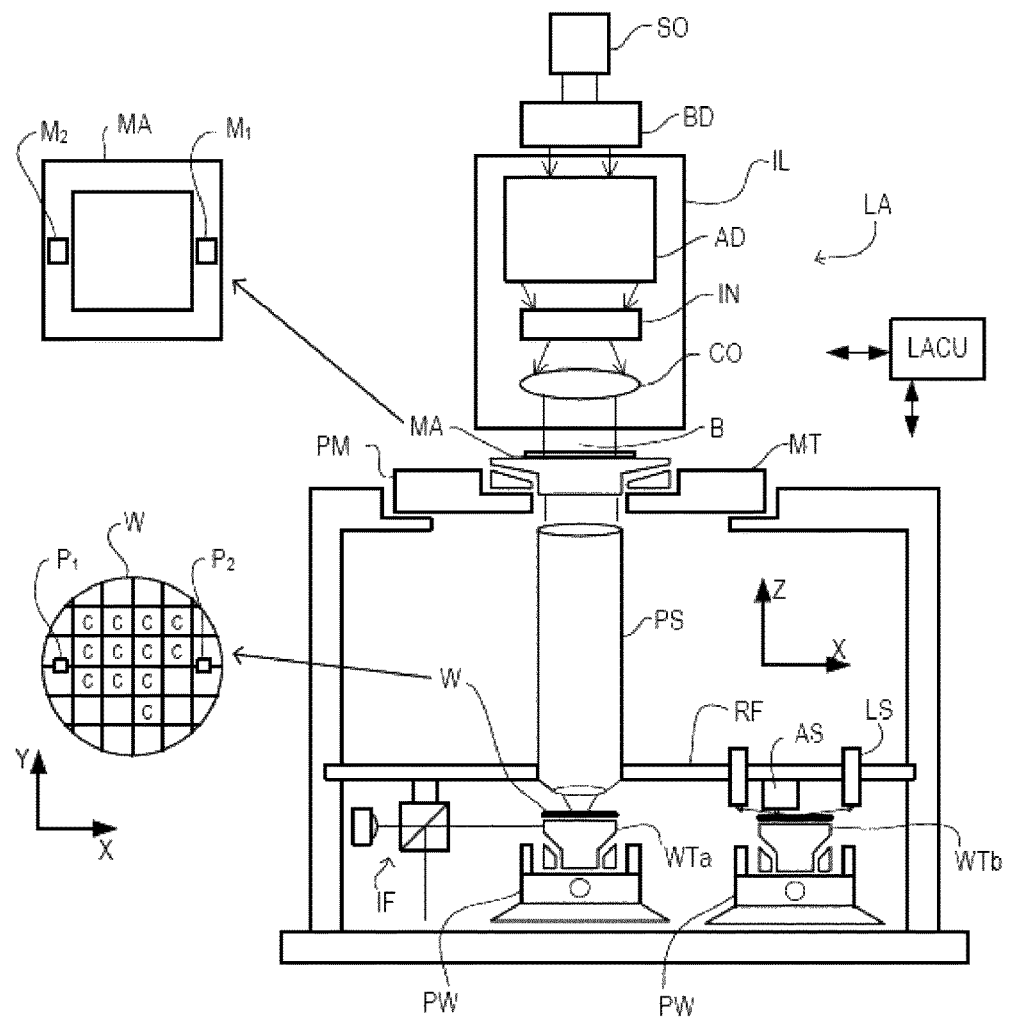
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device.

The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

In accordance with an embodiment of the present invention, the lithographic apparatus LA is configured to perform an exposure method according to the present invention. In particular, the projection system PL may be configured to project a first patterned radiation beam (the radiation beam e.g. being conditioned by the illumination system IL) onto a plurality of target portions C of a substrate W, thereby transferring a first pattern onto each of the target portions C of the substrate, the first pattern including at least one alignment mark. As such, by transferring the first pattern onto a plurality of target portions C, a plurality of alignment marks are also transferred, since the first pattern is assumed to include at least one alignment mark.

The alignment system AS of the lithographic apparatus LA may be configured to measure, for each of the plurality of alignment marks, a position on the substrate (e.g. an x-position, a y-position or an (x,y)-position, the XY-plane being parallel to the surface of the substrate). As such, a plurality of positions of a respective plurality of alignment marks (transferred by means of the first patterned radiation beam) is obtained. Subsequently, a plurality of alignment mark displacements (dx, dy) for the respective plurality of alignment marks may be determined (e.g. by the alignment system AS or the lithographic apparatus control unit LACU) as a difference between a respective predetermined nominal position of the alignment mark and the respective measured position of the alignment mark;

The lithographic apparatus control unit LACU may be configured to fit a mathematical model to the plurality of alignment mark displacements to obtain a fitted mathematical model, and determine a position of the first pattern in each of the plurality of target portions C, based on the fitted mathematical model.

In accordance with the present invention, a mathematical model is applied which comprises the following polynomials Z1 and Z2 as described by equation (501) of FIG. 5.

Polynomials Z1 and Z2 can be considered second order Zernike polynomials.

Once the position of the first pattern in each of the target portions C is known, the projection system PL may be configured to project a second patterned radiation beam (the radiation beam e.g. being conditioned by the illumination system IL) onto the plurality of target portions C of the substrate W, using the determined position of the first pattern in each of the plurality of target portions.

The exposure method according to the present invention will now be explained in more detail.

The exposure method according to the present invention includes the step of fitting a mathematical model to a set of alignment mark measurements, the measurements being performed on an previously transferred pattern, in order to determine a target position for a subsequent pattern.

Within the meaning of the present invention, a 'subsequent pattern' refers to a pattern that is to be provided on top of a previously transferred pattern, i.e. a pattern that is typically present in a lower layer.

In general, during the manufacturing of ICs using a lithographic apparatus, a plurality of patterns are transferred on target portions on a substrate using an exposure process. In order to ensure proper operation of the ICs, the patterns as transferred need to be positioned accurately relative to each other. In particular, assume a substrate being provided with a first (previously transferred) pattern (the plane of the substrate being referred to as the X,Y plane). A subsequent pattern needs to be projected on top of a previously transferred pattern at a particular x,y position relative to the previously transferred pattern. So, prior to the transferring of a subsequent pattern on the target portions, the position of previously transferred pattern needs to be known. Once this position is known, this information can be used, by a control unit of a positioning device (such as positioners PW and PM) to accurately position a mask MA, comprising a pattern that needs to be transferred, and the substrate W relative to each other. In order to determine the location of a pattern on a wafer, alignment marks are transferred to predefined positions on the substrate as part of the pattern that is being transferred or projected. By measuring the position of the alignment marks, information can be obtained which can be used to transfer a subsequent pattern relative to the previously transferred pattern to the substrate. Such alignment marks are typically provided along a circumference of a transferred pattern, e.g. in a scribe lane. On a previously created layer on a substrate, a large number (e.g. 20-200) of such alignment marks may be present.

The accurate position of such alignment marks may be determined using an alignment sensor. In general, when the position of such alignment marks is determined, it will be observed that these positions deviate from an expected nominal position (xc, yc). by comparing the measured position of an alignment mark with the nominal position (xc, yc) of the alignment mark, a displacement (dx, dy) of the alignment mark from the nominal position can be determined. These alignment mark displacements may be caused by deformations of the substrate that were present during the transfer of the pattern and the alignment marks. In order to determine a displacement at another point, a fitting can be done to a mathematical model comprising one or more parameters.

Within the meaning of the present invention, the feature 'mathematical model' is used to denote a set of one or more mathematical relationships (in either polar or Cartesian coordinates) including one or more parameters that are to be determined.

Within the meaning of the present invention, the feature 'fitting a mathematical model to a plurality (or a set) of alignment mark displacements' is used to denote the process of determining a values of the one or more parameters of the set of one or more mathematical relationships using measured values of alignment mark positions.

Once having fitted the mathematical model to the determined alignment mark displacements (dx, dy), i.e. once the parameters of the set of one or more mathematical relationships have been determined, one can estimate or predict, using the fitted mathematical model, the displacement at any other point on the substrate and thus determine the target position of a subsequent pattern.

Within the meaning of the present invention, the feature 'fitted mathematical model' is used to denote the mathematical model used, with the one or more parameters having a particular value as determined during the fitting of the mathematical model to the alignment mark displacements.

As an example, the alignment mark displacements may be used to model or describe the displacement of the previously transferred patterns (relative to a nominal or expected position), that are transferred onto target portions of a substrate, by a mathematical function including a set of parameters describing a translation, a magnification and a rotation. To determine a value of the set of parameters, the mathematical model is fitted to the alignment mark displacements. Such fitting may e.g. include applying a least-squares method or another optimization recipe.

In the above example, a set of alignment mark displacements may thus be used to model a position and shape of a particular (previously transferred) pattern. In this respect, it may be noted that when comparing an actual position of a previously transferred pattern with an expected or nominal position of the pattern, one may also notice that the actual transferred pattern is deformed (i.e. has a different shape) compared to the expected shape. In a known model, a position of a particular portion of a particular pattern may e.g. be modeled by means of a translation, a magnification and a rotation relative to an expected position, thus also taking into account a possible deformation of the transferred pattern (see FIG. 2 for more details). Such a fitted mathematical model may subsequently be used by a control unit of a positioning device (the control unit e.g. being incorporated in the lithographic apparatus control unit LACU as shown in FIG. 1) to position the substrate during the transfer of a subsequent pattern in alignment with the previously transferred pattern.

In order to determine, for each of the target portions on the substrate that need to be exposed, an appropriate modeling of the actual position or shape of a transferred pattern in this target portion (or a modeling of a deviation from an expected position), one could consider using a dedicated set of alignment marks for each target portion. In such case, one could e.g., for each target portion, characterize a translation and deformation of the transferred pattern in the target portion based on measurements of this dedicated set of alignment marks, said set of alignment marks e.g. being provided in scribe lines surrounding the transferred pattern. Such an approach would however require a large amount of alignment marks to be measured.

Such alignment measurement would be rather time-consuming and would thus adversely affect the throughput of the apparatus, the throughput indicating the number of substrates processed per unit of time.

The aforementioned modeling of a displacement of a previously transferred pattern by means of e.g. a translation, a magnification and a rotation is possible by performing only a comparatively small number of alignment mark measurements. The following equations describe a 6-parameter model that can be used to describe an alignment mark displacement in terms of a translation C, magnification M and rotation R. For each measurement of one alignment mark, equations (502) as shown in FIG. 5 can be formed.

where Cx is a translation in x-direction, Cy is a translation in y-direction, Mx is a magnification in x-direction, My is a magnification in y-direction, Rx is a rotation of the x-axis about the z-axis, Ry is a rotation of the y-axis about the z-axis, and dx, dy are the displacements of the alignment mark from the nominal position (xc, yc) in respectively the x- and y-direction. Equation (1) can be considered a set of equations which can be solved for parameters Cx, Cy, Mx, My, Rx, Ry by replacing (x, y) by the nominal position (xc, yc) of an alignment mark and (dx, dy) by the corresponding alignment mark displacement. In this respect, it should however be noted that, within the meaning of the present invention, alignment marks need not necessarily provide positional information in two degrees (e.g. x- and y-direction). Alignment marks that provide only positional information in one degree may be considered as well. Such a one-dimensional alignment mark may e.g. only provide in a value for dx or for dy but not both.

Figure 2:
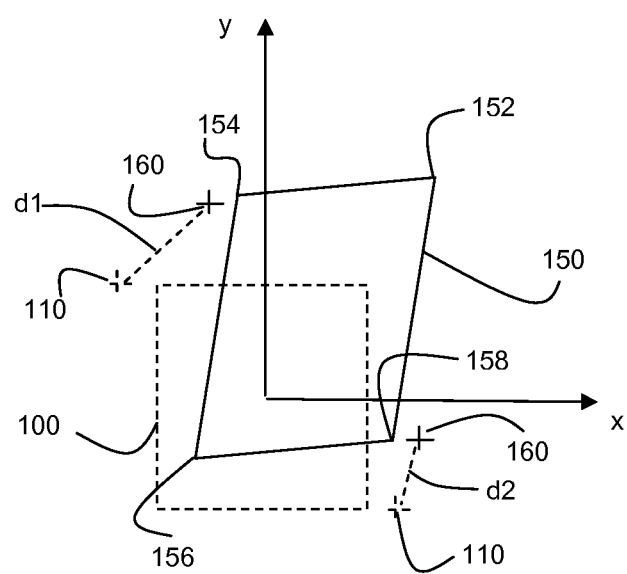
FIG. 2 depicts a nominal position of a transferred pattern and an actual position of the transferred pattern.

FIG. 2 schematically illustrates both a nominal (or expected) position of a transferred pattern 100 (including two alignment marks 110) and an actual position of the transferred pattern 150 and alignment marks 160. As can be seen from comparing the nominal position 100 with the actual position 150 of the pattern, the actual position of pattern 150 cannot be obtained by a mere translation of the nominal position of the transferred pattern 100. Rather, comparing an actual position of the corners of the transferred pattern (152, 154, 156, 158) with the nominal positions of the corners of the pattern 100, one can notice a positive translation in both X- and Y-direction, comparing the length of the line segments 154-156 or 152-158 with the corresponding length in the nominal position 100, one can notice that the transferred pattern has a positive magnification My. In a similar manner, one can observe a magnification Mx which is substantially zero, a clockwise rotation Ry (by comparing the orientation of the line segments 154-156 or 152-158 with the orientation in the nominal position 100) and a counterclockwise rotation Rx. Based on considering multiple alignment mark displacements such as displacements d1 and d2 in FIG. 2, a displacement and/or deformation of a transferred pattern may be determined, as explained in more detail below.

In order to determine the parameters (Cx, Cy, Mx, My, Rx and Ry) of the model, at least 3 alignment mark measurements (providing a measured dx and dy value) are needed. In general, more measurements will be available. This leads to solving an over-determined set of equations. A solution for such a set of equations can be found using the well-known Least Square Method.

In a further simplification, the magnifications Mx and My may be assumed equal, Mx=My=M and/or the rotations Rx and Ry may be assumed equal, Rx=Ry=R.

Such a comparatively simple model may however result in a modelling of the displacement of the patterns that are transferred onto target portions which is insufficiently accurate to obtain a desired matching between subsequent layers. As a result, a inaccurate alignment between subsequent layers may occur. Such inaccurate alignment, which can be characterized by an overlay error, may adversely affect the operation of the IC that is manufactured.

In order to address this, it has been proposed in the past to model the alignment mark displacements using more complex, higher order models which include a comparatively large number of parameters, typically ranging from 20-40.

Such models may e.g. include higher order polynomials or a large number of mathematical relationships such as e.g. radial base functions. Although such models are, in theory, suited to model any possible type of distortion or deformation (by selecting a model with a sufficiently large number of variables or parameters), there are several drawbacks to the use of such extensive models.

Because of the comparatively large number of parameters that need to be solved, a large number of measurements (alignment mark measurements) need to be performed in order to determined the parameters of the higher order model.

The use of complex higher order models may further, due to the comparatively large number of parameters need not necessarily result in an improved accuracy. In case a large set of equations needs to be solved, the, the accuracy of the derived parameters may adversely be affected. Because each measurement introduces, to some extent, a measurement error, the accuracy of a derived parameter may be reduce when more measurements are considered.

It would therefore be desirable to obtain an accurate model or characterization of the position or shape of each transferred pattern using only a comparatively low number of alignment mark measurements.

In the present invention, this is realized by the following considerations.

It has been observed by the inventors that when considering the positional deviations of alignment marks as perceived, one may notice that these deviations contain particular patterns. Such patterns can be visualized by measuring a large number of alignment marks and representing a measured positional deviation of each mark by a vector in the X,Y plane. When such a pattern is observed, one may be able to determine a mathematical function describing such a particular pattern. Such a mathematical function could e.g. be characterized or described by a small number of parameters, e.g. 2-5.

Compared to known higher order models, the model as applied in the present invention is based on an observed deformation pattern. This observation allows for the selection of a particular mathematical function or model describing such a pattern instead of applying a large number of parameters in a higher order model.

Due to the limited number of parameters to characterize or describe such a particular mathematical function, it may be sufficient to perform only a comparatively small number of alignment mark measurements, e.g. compared to performing a mapping to a complex model comprising higher order polynomials.

In particular, when displaying alignment mark displacements in a 2D graph, it has been noticed that a double vortex pattern may occur.

Figure 3:
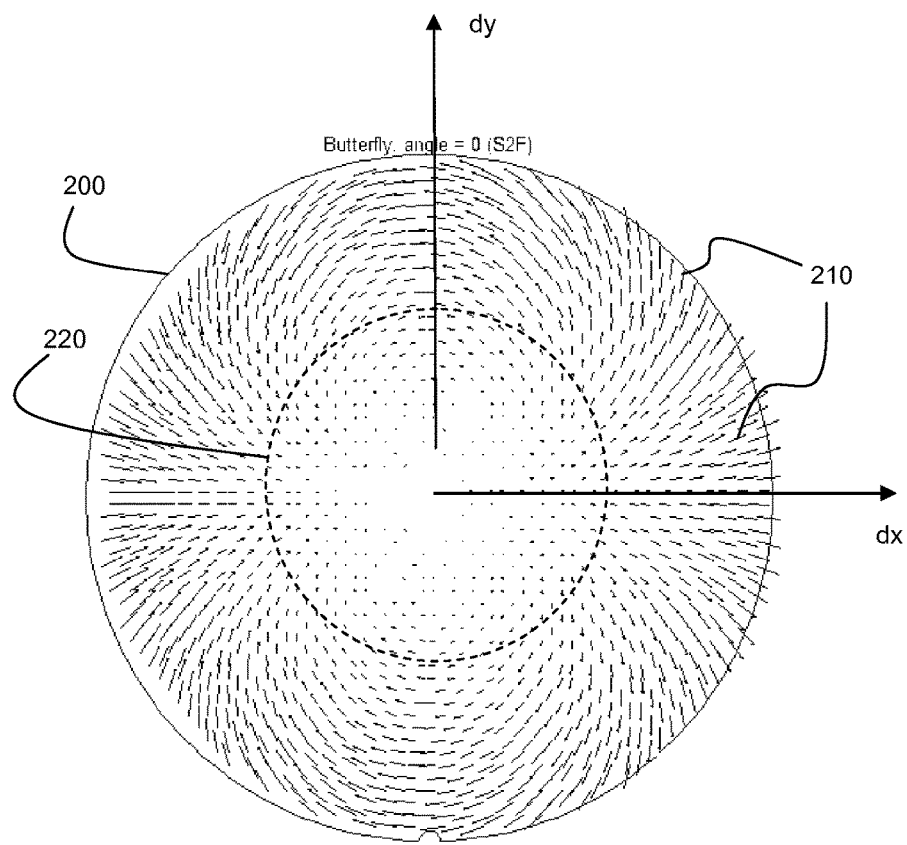
FIG. 3 depicts a 2D graphs of alignment mark displacements illustrating a double vortex pattern.

In FIG. 3, such a 2D graph is schematically shown. In FIG. 3, a contour 200 of a substrate is schematically shown, combined with a plurality of line segments 210 representing alignment mark displacements, i.e. positional deviations from a nominal position, as can be derived from alignment mark measurements.

It has been devised by the inventors, that such a double vortex pattern may be modelled by using only two second order polynomials Z1, Z2 as shown in FIG. 5, equation (501), More specifically, when describing the alignment mark displacements (dx, dy) according to equation (503) as shown in FIG. 5, a double vortex pattern can be observed.

In order to map a set of alignment mark displacements (dx, dy) onto a mathematical model including the aforementioned polynomials, one can consider that the observed pattern (i.e. the double vortex pattern as e.g. shown in FIG. 3) has a certain orientation and a certain amplitude.

Therefore, in an embodiment of the exposure method according to the present invention, two parameters are introduced for each of the polynomials Z1, Z2 to arrive at the modelling of the alignment mark displacements (dx, dy) according to equation (504) of FIG. 5, whereby: $\mu x$, $\mu y$ represent an amplitude of the polynomials and $\alpha x$, $\alpha y$ represent a radial orientation of the polynomials used in the model.

In an embodiment, parameters $\mu x$ and $\alpha x$ are determined by performing a least square fitting using the alignment mark displacements dx, parameters $\mu y$ and $\alpha y$ are determined by performing a least square fitting using the alignment mark displacements dy. This thus constitutes a 4-parameter fitting according to equation (504). Typically, the number of alignment marks measured may be in a range from 10-20, resulting in an over-determined set of equations. In such case, the parameters $\mu x$, $\mu y$, $\alpha x$, $\alpha y$ may e.g. be determined using a Least Squares Method or any other type of data fitting method.

In an embodiment of the present invention, the following assumptions are made: $\mu x = \mu y = \mu$ and $\alpha x = \alpha y = \alpha$. In such embodiment, it is thus assumed that the dx data only differs from the dy data by an angle of 90°.

Therefore, the mathematical model used in this embodiment for fitting to the alignment mark displacements (dx, dy) only has two parameters ($\mu$, $\alpha$) that need to be determined, as can be seen from equation (505) of FIG. 5.

It should be noted that r and $\theta$ are known in equation (505) as they refer to the nominal positions of the alignment markers. ($\mu$, $\alpha$) are thus the only unknowns in equation (505), given a set of alignment mark displacements (dx, dy).

In general, equations (504) and (505) may be solved by replacing (r, $\theta$) by the nominal position (rc, $\theta$c) of an alignment mark and (dx, dy) by the corresponding alignment mark displacement.

A possible way to solve equation (505) is as follows:
Equation (505) may be rewritten to equation (601) of FIG. 6.

By introducing parameters C1 and C2 according to equation (602) of FIG. 6, equation (601) of FIG. 6 can be rewritten to equation (603) of FIG. 6

Assuming that N dx measurements and M dy measurements are made, equation (603) thus represents a set of N+M equations which can be casted in the matrix form according to equation (604) of FIG. 6:

Matrices Ax and Ay are derived from the positional information of the alignment marks used. As an example, ($r_1$, $\theta_1$) may represent the nominal position of an alignment mark associated with alignment mark displacement (dx(1), dy(1))

Equation (604) may subsequently be solved for the unknown parameters C1 and C2, e.g. using a Least Squares Method. Once C1 and C2 are determined, parameters ($\mu$, $\alpha$) may be determined according to equation (605) as shown in FIG. 6.

As mentioned above, the mathematical model as applied in an embodiment of the present invention only requires solving for 4 parameters (equation (504)) or 2 parameters (equation (505)).

As such, only a limited number of alignment mark measurements needs to be performed, in order to determine the required parameters.

In order to improve the accuracy of the fitting step, it may be advantageous to select a set of alignment marks having a comparatively large displacement. When considering FIG. 3, one can see that the alignment mark displacements 210 are comparatively small in an inner region of the substrate, e.g. defined as a circular region 220 having a radius equal to half the radius of the substrate 200. It may thus be advantageous to select the alignment marks for measurement outside said region.

In an embodiment of the present invention, the mathematical model as applied (i.e. comprising the polynomials Z1 and Z2 may advantageously be combined with the aforementioned 6-parameter model described in equation (502).

In this respect, it is worth noting that the 6-parameter model of equation (502) and the model according to equations (504) or (505) are orthogonal.

In an embodiment of the method according to the present invention, both models are combined into one model that is mapped to the alignment mark displacements (dx, dy), which can be described by equation (701) of FIG. 7.

Equation (701) has 10 unknown parameters that may be determined in a similar manner as discussed above. The number of parameters of the model applied in equation (701) may further be reduced by applying one or more of the constraints of equation (702) shown in FIG. 7:

Due to the models being orthogonal, equations (502) and (504) or (505) may also be solved sequentially. As such, in an embodiment of the present invention, the step of fitting a mathematical model to the alignment mark displacements may comprise:

fitting a first mathematical model of the mathematical model to the alignment mark displacements by solving equation (502)

determining a residual (dx', dy') of each of the alignment mark displacements as a difference between the alignment mark displacements and a calculated set of alignment mark displacements using the fitted first mathematical model fitting the residual (dx', dy') of each of the alignment mark displacements to a second mathematical model of the mathematical model, wherein the second mathematical model comprises the polynomials Z1 and Z2.

Figure 4:
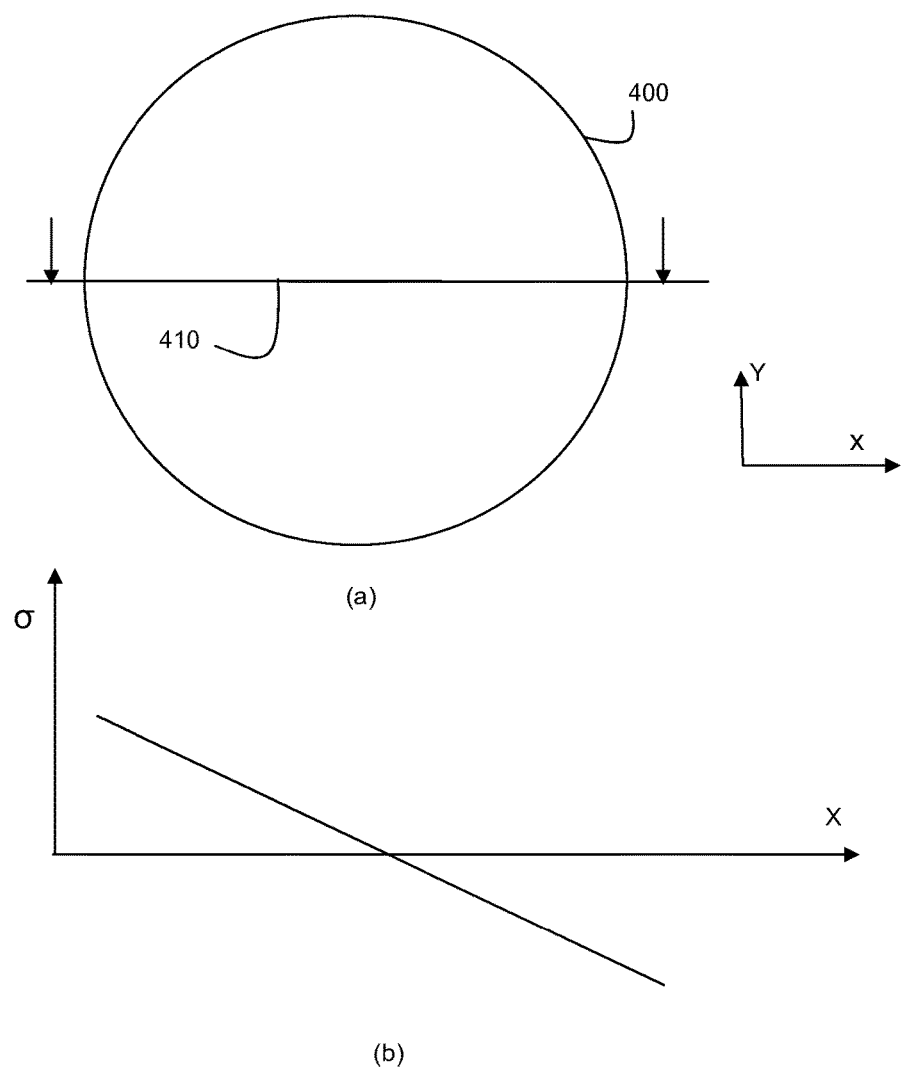
FIG. 4 depicts a linear stress distribution along a cross-section of a substrate.

With respect to the aforementioned double vortex pattern which has been observed in graphs of alignment mark displacements, it is worth mentioning that the inventors have also derived the underlying cause of such deformation. It can be shown that a substrate deformation may comprise a double vortex pattern, as e.g. shown FIG. 3, when the substrate is subject to a linear stress distribution. Such a linear stress distribution is schematically illustrated in FIG. 4, whereby FIG. 4 (a) schematically shows a top view of a substrate 400 and a cross-sectional line 410 along which the stress 6 is determined. FIG. 4 (b) schematically showing the stress 6 along line 410. The stress is assumed to be substantially constant in the Y-direction. Possible root causes of such stress distribution are e.g. linear temperature distribution over the substrate surface or an occurring deformation during processing such as a bake process. During such processing, the occurring deformation may become a permanent deformation of the substrate. Such deformation may e.g. occur due to a mismatch of the thermal expansion coefficient of a substrate and a film deposited on the substrate and the application of comparatively fast cooling down.

As such, in the present invention, a different approach all together is applied to ensure proper alignment between two consecutive patterns on a substrate; rather than applying a complex mathematical model suited to model virtually any arbitrary deformation, the approach adhered in the present invention is to analyse deformation patterns or stress distributions and apply dedicated mathematical functions describing such real-life-based deformation patterns. As a result, the number of parameters that needs to be determined can be reduced significantly.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An exposure method comprising:
    transferring a first pattern onto each of a plurality of target portions of a substrate, the first pattern including at least one alignment mark;
    measuring a plurality of positions of the respective transferred plurality of alignment marks and determining a plurality of alignment mark displacements (dx, dy) for the respective plurality of alignment marks as a difference between a respective predetermined nominal position of the alignment mark and the respective measured position of the alignment mark;
    fitting a mathematical model to the plurality of alignment mark displacements to obtain a fitted mathematical model;
    determining a position of the first pattern in each of the plurality of target portions, based on the fitted mathematical model; and
    transferring a second pattern onto each of the plurality of target portions, using the determined position of the first pattern in each of the plurality of target portions,
    wherein the mathematical model comprises polynomials Z1 and Z2:

$Z1=r^2 \cos(2\theta)$ $Z2=r^2 \sin(2\theta)$ in polar coordinates $(r,\theta)$ or $Z1=x^2-y^2$ $Z2=xy$ in Cartesian coordinates $(x,y)$, and wherein the fitting of the mathematical model includes determining a value for each of one or more parameters representing an amplitude and/or orientation of the polynomials Z1 and Z2.

2. The exposure method according to claim 1, wherein the fitting of the mathematical model to the alignment mark displacements (dx, dy) includes solving:

$$\begin{pmatrix} dx \\ dy \end{pmatrix} = \begin{pmatrix} \mu x \cdot r^2 \cos(2\theta - \alpha x) \\ \mu y \cdot r^2 \sin(2\theta - \alpha y) \end{pmatrix}$$

for parameters $\mu x$, $\mu y$, $\alpha x$, $\alpha y$ representing an amplitude and radial orientation of the polynomials Z1 and Z2.

3. The exposure method according to claim 2, wherein $\rho x=\mu y$ and $\alpha x=\alpha y$.

4. The exposure method according to claim 1, wherein the mathematical model includes a function representing a magnification M, a rotation R or a translation T.

5. The exposure method according to claim 4, wherein fitting the mathematical model to the alignment mark displacements comprises fitting a first mathematical submodel of the mathematical model to the alignment mark displacements by solving:

$dx=Mx \cdot x - Ry \cdot y + Cx$ $dy=Rx \cdot x - My \cdot y + Cy$ wherein Mx, My represent a magnification in respectively x and y directions, Cx, Cy represent a translation in respectively x and y directions and Rx, Ry represent a rotation of respectively the x-axis and the y-axis, about the z-axis;
    determining a residual (dx', dy') of each of the alignment mark displacements as a difference between the alignment mark displacements and a calculated set of alignment mark displacements using the fitted first mathematical submodel; and
    fitting the residual (dx', dy') of each of the alignment mark displacements to a second mathematical submodel of the mathematical model, wherein the second mathematical submodel comprises the polynomials Z1 and Z2.

6. The exposure method according to claim 5, wherein Mx=My and Rx=Ry.

7. The exposure method according to claim 1, wherein the plurality of alignment marks are selected outside an inner region of the substrate.

8. The exposure method according to claim 7, wherein the inner region is a circular region having a radius equal to half a radius of the substrate.

9. A method comprising:
    determining a position of a first pattern in each of a plurality of target portions on a substrate, based on a fitted mathematical model, wherein the first pattern includes at least one alignment mark, wherein the mathematical model is fitted to a plurality of alignment mark displacements (dx, dy) for the plurality of alignment marks in the target portions, and wherein the alignment mark displacements area difference between a respective nominal position of the alignment mark and measured position of the alignment mark; and
    transferring a second pattern onto each of the plurality of target portions, using the determined position of the first pattern in each of the target portions,
    wherein the mathematical model consists essentially of polynomials Z1 and Z2:

$Z1=r^2 \cos(2\theta)$ $Z2=r^2 \sin(2\theta)$ in polar coordinates $(r,\theta)$ or $Z1=x^2-y^2$ $Z2=xy$ in Cartesian coordinates $(x, y)$.

10. The method according to claim 9, further comprising fitting the mathematical model, the fitting of the mathematical model to the alignment mark displacements (dx, dy) includes solving:

$$\begin{pmatrix} dx \\ dy \end{pmatrix} = \begin{pmatrix} \mu x \cdot r^2 \cos(2\theta - \alpha x) \\ \mu y \cdot r^2 \sin(2\theta - \alpha y) \end{pmatrix}$$

for parameters $\mu x$, $\mu y$, $\alpha x$, $\alpha y$ representing an amplitude and radial orientation of the polynomials Z1 and Z2.

11. The method according to claim 10, wherein $\mu x=\mu y$ and $\alpha x=\alpha y$.

12. The method according to claim 9, further comprising fitting the mathematical model and the fitting the mathematical model to the alignment mark displacements comprises fitting a further mathematical model to the alignment mark displacements by solving:

$dx=Mx \cdot x - Ry \cdot y + Cx$ $dy=Rx \cdot x - My \cdot y + Cy$ wherein Mx, My represent a magnification in respectively x and y directions, Cx, Cy represent a translation in respectively x and y directions and Rx, Ry represent a rotation of respectively the x-axis and the y-axis, about the z-axis;
    determining a residual (dx', dy') of each of the alignment mark displacements as a difference between the alignment mark displacements and a calculated set of alignment mark displacements using the fitted further mathematical submodel; and fitting the residual (dx', dy') of each of the alignment mark displacements the mathematical model having the polynomials Z1 and Z2.

13. The method according to claim 12, wherein Mx=My and Rx=Ry.

14. The method according to claim 9, wherein the plurality of alignment marks are selected outside an inner region of the substrate, the inner region comprising a circular region having a radius equal to half a radius of the substrate.

15. A computer program product comprising a non-transitory computer readable medium having instructions recorded thereon, the instructions when executed, configured to cause a computer to at least:
   determine a position of a first pattern in each of a plurality of target portions on a substrate, based on a fitted mathematical model, wherein the first pattern includes at least one alignment mark, wherein the mathematical model is fitted to a plurality of alignment mark displacements (dx, dy) for the plurality of alignment marks in the target portions, and wherein the alignment mark displacements are a difference between a respective nominal position of the alignment mark and measured position of the alignment mark; and
   cause or have caused transfer of a second pattern onto each of the plurality of target portions, using the determined position of the first pattern in each of the target portions,
   wherein the mathematical model comprises polynomials Z1 and Z2:

$Z1=r^2 \cos(2\theta)$  $Z2=r^2 \sin(2\theta)$ in polar coordinates $(r,\theta)$ or $Z1=x^2-y^2$  $Z2=xy$ in Cartesian coordinates $(x,y)$, and wherein the mathematical model includes a value for each of one or more parameters representing an amplitude and orientation of the polynomials Z1 and Z2.

16. A computer program product comprising a non-transitory computer readable medium having instructions recorded thereon, the instructions when executed, configured to cause a computer to at least:
   determine a position of a first pattern in each of a plurality of target portions on a substrate, based on a fitted mathematical model, wherein the first pattern includes at least one alignment mark, wherein the mathematical model is fitted to a plurality of alignment mark displacements (dx, dy) for the plurality of alignment marks in the target portions, and wherein the alignment mark displacements are a difference between a respective nominal position of the alignment mark and measured position of the alignment mark; and
   cause or have caused transfer of a second pattern onto each of the plurality of target portions, using the determined position of the first pattern in each of the target portions,
   wherein the mathematical model consists essentially of polynomials Z1 and Z2:

$Z1=r^2 \cos(2\theta)$  $Z2=r^2 \sin(2\theta)$ in polar coordinates $(r,\theta)$ or $Z1=x^2-y^2$  $Z2=xy$ in Cartesian coordinates $(x,y)$.

17. The computer program product of claim 16, further comprising instructions configured to fit the mathematical model by at least determination of a value for each of one or more parameters representing an amplitude and/or orientation of the polynomials Z1 and Z2.

18. The computer program product of claim 16, further comprising instructions configured to fit the mathematical model to the alignment mark displacements (dx, dy) by at least solution of:

$$\begin{pmatrix} dx \\ dy \end{pmatrix} = \begin{pmatrix} \mu x \cdot r^2 \cos(2\theta - \alpha x) \\ \mu y \cdot r^2 \sin(2\theta - \alpha y) \end{pmatrix}$$

for parameters μx, μy, αx, αy representing an amplitude and radial orientation of the polynomials Z1 and Z2.

19. The computer program product of claim 18, wherein μx=μy and αx=αy.

20. A lithographic apparatus comprising a projection system configured to transfer a pattern onto a substrate and the computer program product of claim 16.

21. A computer program product comprising a non-transitory computer readable medium having instructions recorded thereon, the instructions when executed, configured to cause a computer to at least:
   determine a position of a first pattern in each of a plurality of target portions on a substrate, based on a fitted mathematical model, wherein the first pattern includes at least one alignment mark, wherein the mathematical model is fitted to a plurality of alignment mark displacements (dx, dy) for the plurality of alignment marks in the target portions, and wherein the alignment mark displacements are a difference between a respective nominal position of the alignment mark and measured position of the alignment mark; and
   cause or have caused transfer of a second pattern onto each of the plurality of target portions, using the determined position of the first pattern in each of the target portions,
   wherein the mathematical model comprises polynomials Z1 and Z2:

$Z1=r^2 \cos(2\theta)$  $Z2=r^2 \sin(2\theta)$ in polar coordinates $(r,\theta)$ or $Z1=x^2-y^2$  $Z2=xy$ in Cartesian coordinates $(x,y)$, and wherein the mathematical model is fitted to the alignment mark displacements (dx, dy) by at least solving:

$$\begin{pmatrix} dx \\ dy \end{pmatrix} = \begin{pmatrix} \mu x \cdot r^2 \cos(2\theta - \alpha x) \\ \mu y \cdot r^2 \sin(2\theta - \alpha y) \end{pmatrix}$$

for parameters μx, μy, αx, αy representing an amplitude and radial orientation of the polynomials Z1 and Z2.

22. A lithographic apparatus comprising a projection system configured to transfer a pattern onto a substrate and the computer program product of claim 21.

* * * * *